(12) United States Patent
Mendis

(10) Patent No.: US 8,754,777 B1
(45) Date of Patent: Jun. 17, 2014

(54) SYSTEM AND METHOD FOR PREDICTING USER ROUTE AND DESTINATION

(75) Inventor: Charles Mendis, Mountain View, CA (US)

(73) Assignee: Google Inc., Mountain View, CA (US)

( * ) Notice: Subject to any disclaimer, the term of this patent is extended or adjusted under 35 U.S.C. 154(b) by 643 days.

(21) Appl. No.: 12/856,119

(22) Filed: Aug. 13, 2010

(51) Int. Cl.
*G03B 21/00* (2006.01)

(52) U.S. Cl.
USPC ............... 340/636.1; 340/636.2; 340/286.14; 340/995.1; 340/995.17; 340/995.19; 701/29; 701/410

(58) Field of Classification Search
USPC .......... 340/636.1–636.2, 426.19, 990, 995.1, 340/995.12, 995.17, 995.19, 286.14; 701/410–426
See application file for complete search history.

(56) References Cited

U.S. PATENT DOCUMENTS

| | | | | |
|---|---|---|---|---|
| 5,283,513 | A * | 2/1994 | Fujita et al. | 320/138 |
| 5,774,824 | A * | 6/1998 | Streit et al. | 701/446 |
| 6,317,686 | B1 | 11/2001 | Ran | |
| 6,591,188 | B1 | 7/2003 | Ohler | |
| 7,130,743 | B2 | 10/2006 | Kudo et al. | |
| 7,221,928 | B2 | 5/2007 | Laird et al. | |
| 7,289,039 | B2 | 10/2007 | Kato et al. | |
| 7,400,973 | B2 | 7/2008 | Okochi | |
| 7,487,918 | B2 | 2/2009 | Kudo et al. | |
| 7,536,258 | B2 | 5/2009 | Kudo et al. | |
| 7,630,828 | B2 | 12/2009 | Tajima et al. | |
| 7,783,421 | B2 | 8/2010 | Arai et al. | |
| 7,822,547 | B2 | 10/2010 | Lindroos | |
| 7,869,942 | B2 | 1/2011 | Naito et al. | |
| 8,131,467 | B2 | 3/2012 | Yoshioka et al. | |
| 8,185,304 | B2 | 5/2012 | Insolia et al. | |
| 8,359,133 | B2 * | 1/2013 | Yu et al. | 701/22 |
| 2002/0067379 | A1 | 6/2002 | Kenyon et al. | |
| 2002/0120396 | A1 | 8/2002 | Boies et al. | |
| 2002/0128766 | A1 | 9/2002 | Petzold et al. | |
| 2003/0182052 | A1 | 9/2003 | DeLorme et al. | |
| 2004/0128066 | A1 | 7/2004 | Kudo et al. | |
| 2005/0192742 | A1 | 9/2005 | Okochi | |
| 2006/0105795 | A1 | 5/2006 | Cermak et al. | |

(Continued)

FOREIGN PATENT DOCUMENTS

| | | |
|---|---|---|
| WO | 2006073997 | 7/2006 |
| WO | 2007008809 A2 | 1/2007 |

OTHER PUBLICATIONS

Lorraine McGinty and Barry Smyth, "Personalised Route Planning: A Case-Based Approach", E. Blanzieri and L. Portinale (Eds.): EWCBR 2000, LNAI 1898, pp. 431-443, 2000.

(Continued)

*Primary Examiner* — Daniel Wu
*Assistant Examiner* — Son M Tang
(74) *Attorney, Agent, or Firm* — McDermott Will & Emery LLP

(57) ABSTRACT

Systems and methods display data relevant to a user's trip along an inferred route and destination of a user device. First, the method receives a current device location from the device. Next, historical route and destination data of users that traveled through the current device location is retrieved. Determining a most likely route and destination of the user is determined. Points of interest along the inferred route are retrieved. The points of interest and the inferred route are transmitted to the device. Furthermore, a module calculates whether there is enough extant battery capacity to sustain the inferred route to the inferred destination.

10 Claims, 7 Drawing Sheets

(56) References Cited

U.S. PATENT DOCUMENTS

| | | | |
|---|---|---|---|
| 2007/0016368 A1 | 1/2007 | Chapin et al. | |
| 2007/0233384 A1 | 10/2007 | Lee | |
| 2008/0048856 A1 | 2/2008 | Culpepper et al. | |
| 2008/0059055 A1 | 3/2008 | Geelen et al. | |
| 2008/0068261 A1* | 3/2008 | Hempel | 342/357.06 |
| 2010/0114485 A1 | 5/2010 | Bhogal et al. | |
| 2010/0138098 A1* | 6/2010 | Takahara et al. | 701/29 |
| 2010/0248677 A1* | 9/2010 | Ponce | 455/343.1 |
| 2011/0077854 A1* | 3/2011 | Fushiki et al. | 701/201 |
| 2011/0172867 A1* | 7/2011 | Yu et al. | 701/22 |
| 2012/0265433 A1 | 10/2012 | Viola et al. | |

OTHER PUBLICATIONS http://travelogue.blogsailor.com/indian-maps-with-driving-directions/.

Lorraine McGinty and Barry Smyth, "Personalised Route Planning: A Case-Based Approach", E Blanzieri and L. Portinale (Eds.): EWCBR 2000, LNAI 1898, pp. 431-443, 2000.

http://themarketingblog.wordpress.com/2007/05/28/routegurucom/.

http://silicontryst.wordpress.com/2007/10/27/driving-direction-launch-by-yahoo-an-analysis/.

Jon Froehlich, John Krumm, Route Prediction From Trip Observations, 2008 SAE International.

Julia Letchner, John Krumm, Eric Horvitz, Trip Router With Individualized Preferences (TRIP) Incorporating Personalization into Route Planning, 2006.

Stefan Schroedl, Kiri Wagstafff, Seth Rogers, Pat Langley, Christopher Wilson, Mining GPS for Map Refinement, 2004.

Humbad, "Suitability of Distributed Mobile Wireless Networking For Urban Traffic Congestion Mitigation", Masters' Thesis, Massachusetts Institute of Technology, Published Jun. 2001.

PCT Notification of Transmittal of the International Search Report and the Written Opinion of the International Searching Authority, or the Declaration for PCT/US 09/64311, Jan. 13, 2010, 9 pages.

\* cited by examiner

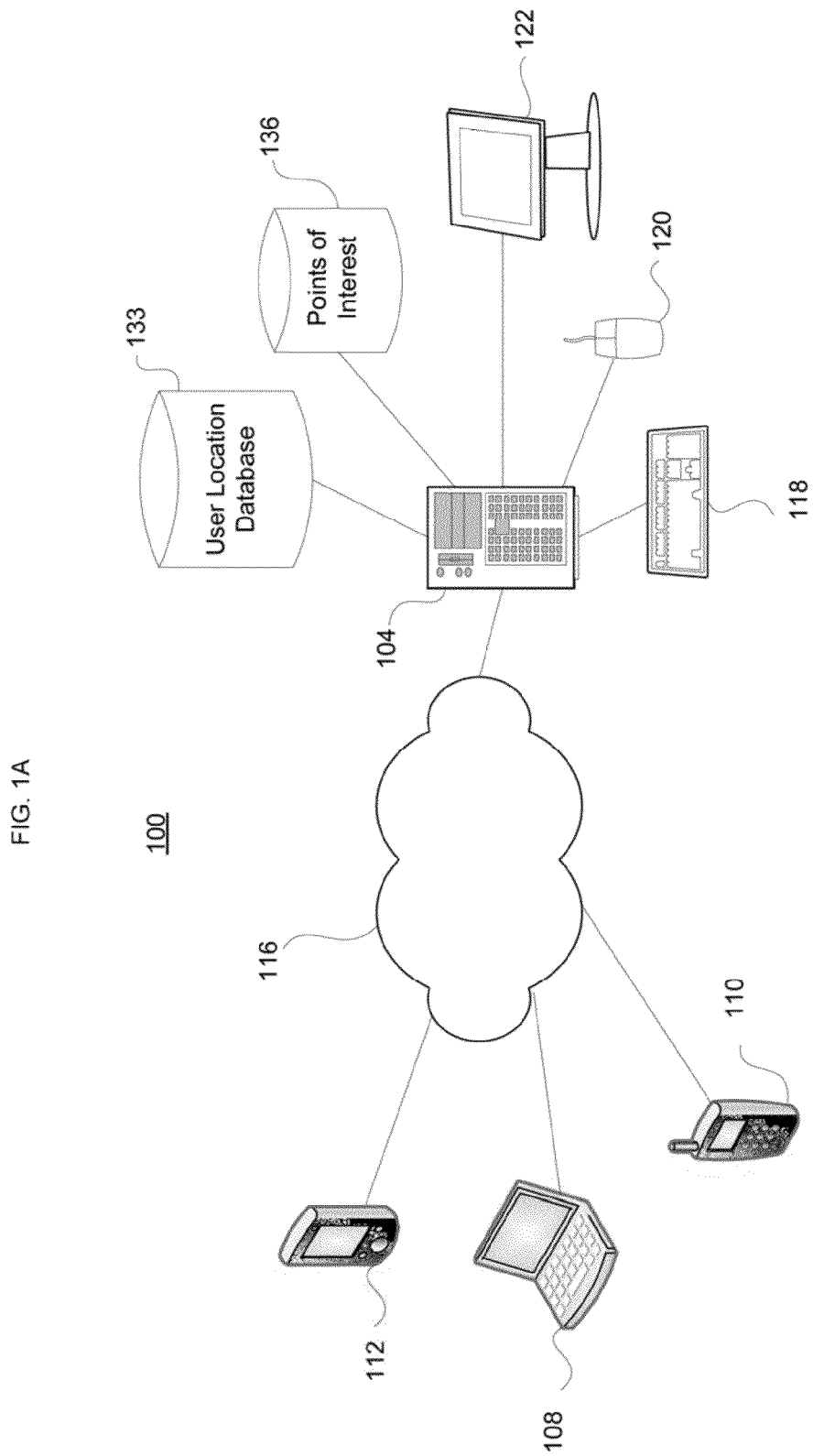

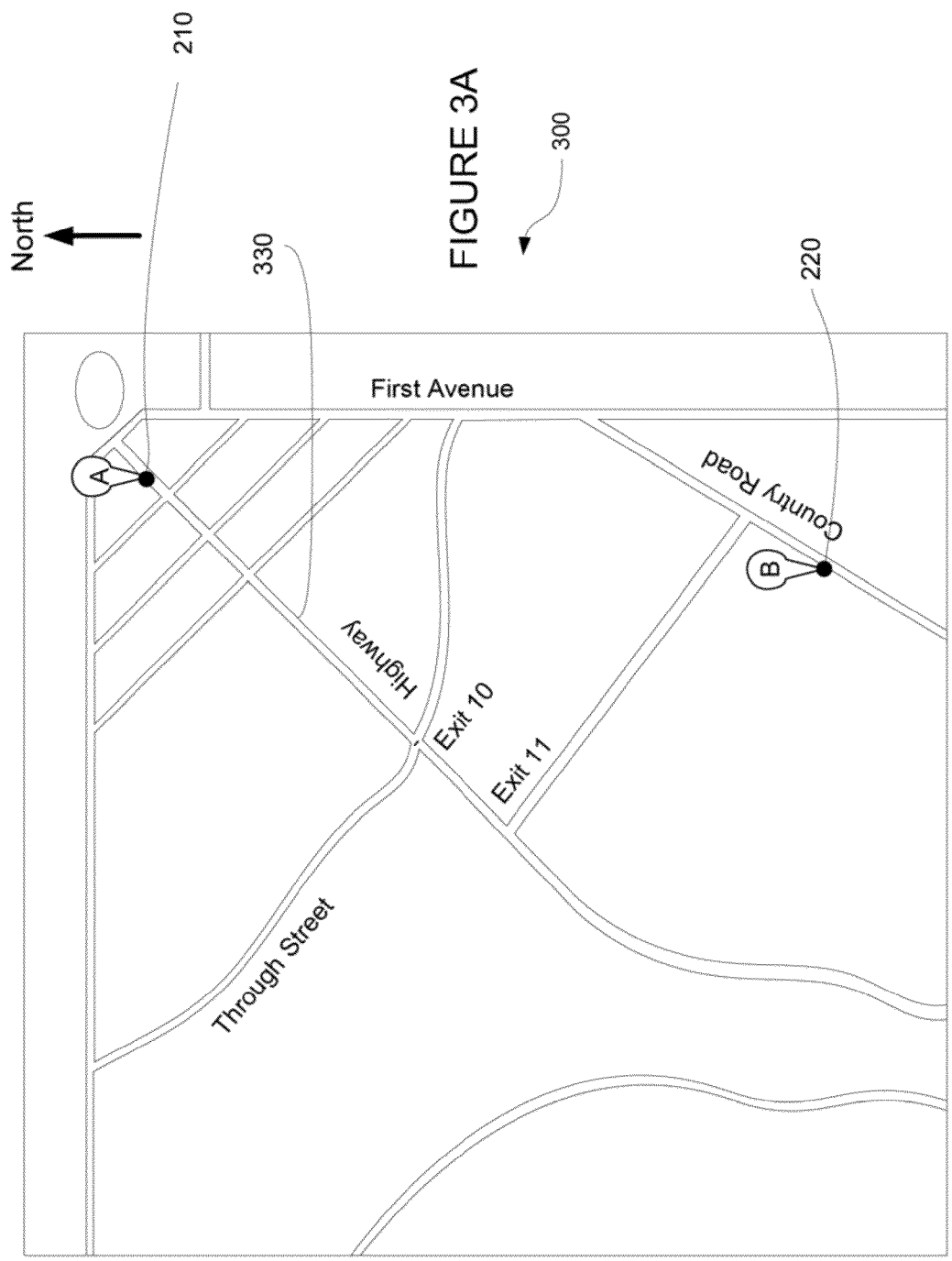

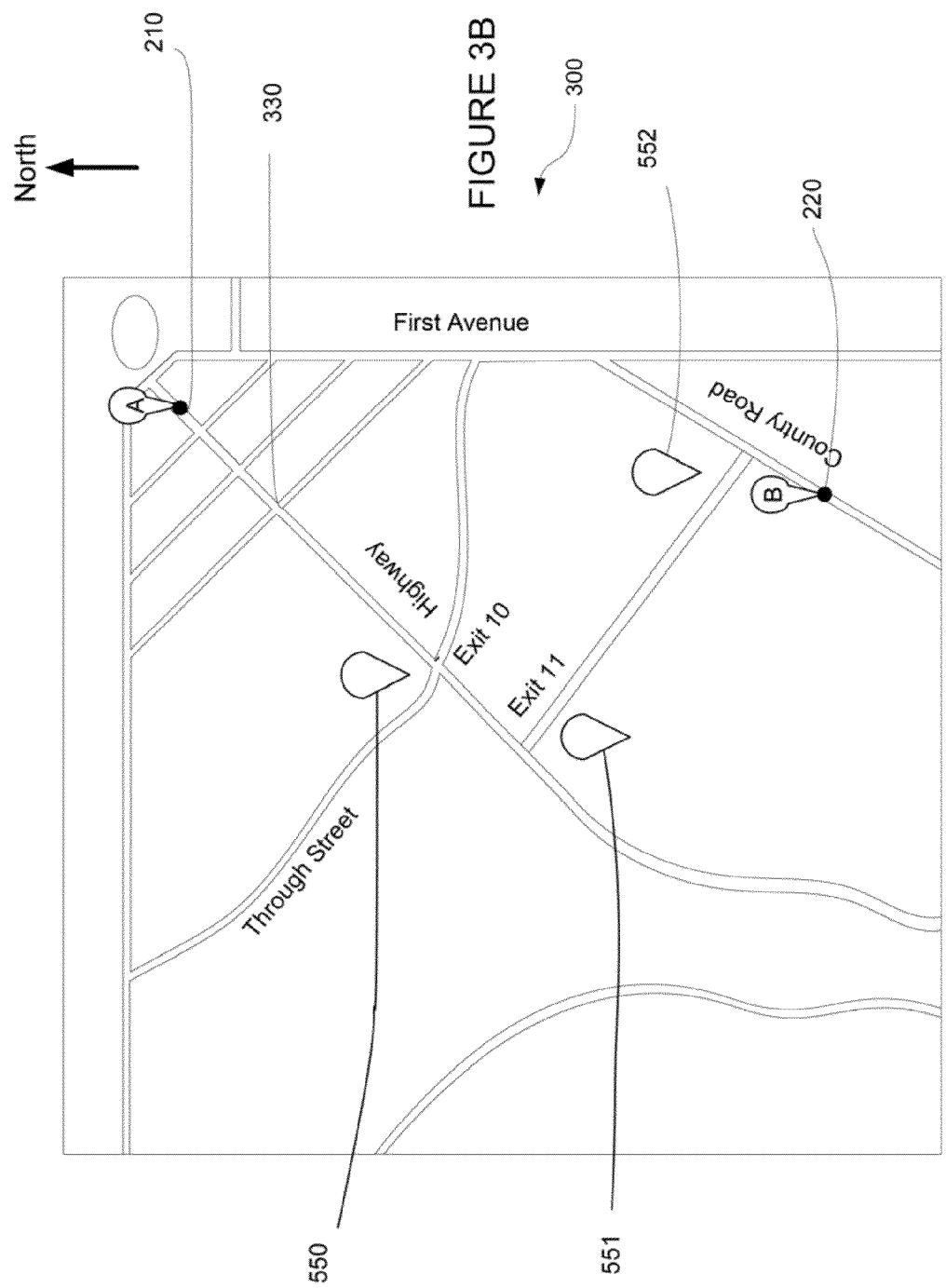

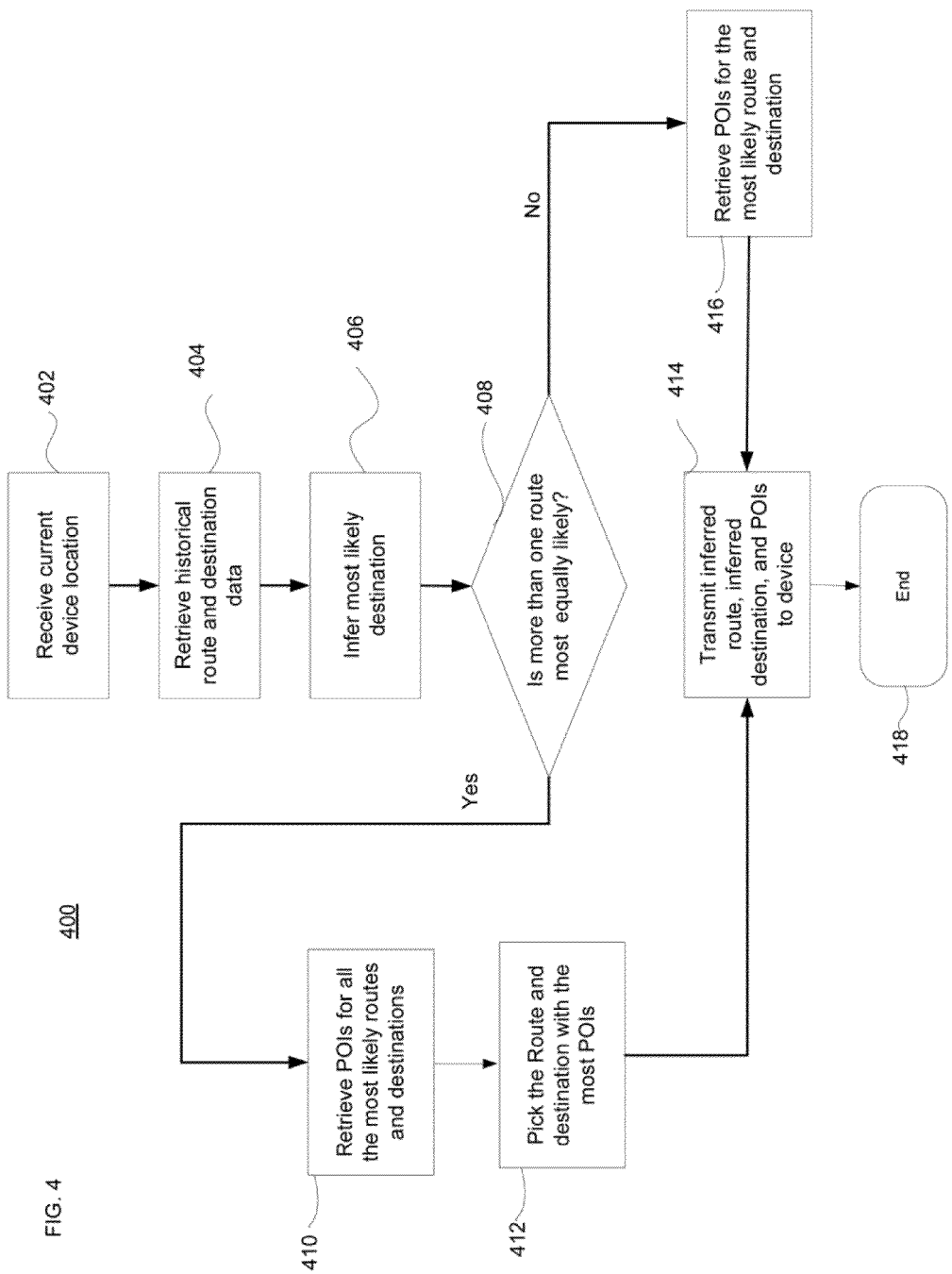

SYSTEM AND METHOD FOR PREDICTING USER ROUTE AND DESTINATION

BACKGROUND OF THE INVENTION

1. Field of the Invention

The present invention relates generally to location-based services and applications for mobile users. More particularly, aspects of the invention relate to predicting a user's route and destination in order to provide information relevant to an inferred trip.

2. Description of Related Art

Various mobile devices provide users with access to the Internet while a user is in motion. These systems include palmtop computers, mobile phones, or laptops. Many of these devices employ global positioning receivers to determine the precise location of the mobile device. Users may drive with these electronic devices to search for points of interest along their route or check e-mail while they are traveling. These mobile devices provide access to Internet data that may be helpful when a user is on the road.

Unfortunately, mobile devices do not provide seamless access to data relevant to a user's road trip. For example, a user may manually search points of interest located on the way to a destination using a search engine, such as Google. Manually searching for points of interest while driving may be cumbersome and the user may enter search terms that are not optimal for comprehensive search results. Moreover, the mobile device's battery may not have enough power to sustain operation during the entire trip.

BRIEF SUMMARY OF THE INVENTION

Aspects of the present invention provide systems and methods that predict a user's route and destination in order to provide automatic alerts relevant to the user's trip, such as points of interest, trip information and battery life indication.

One aspect of the present invention provides a method for displaying points of interest along a route of a user device, the method comprising, receiving a current device location from the user device; retrieving historical route and destination data of users that traveled through the current device location; determining a most likely route and an expected destination of the user device; retrieving points of interest located along the most likely route to the expected destination; and transmitting the points of interest, the most likely route, and the expected destination to the user device. In one example, the method further comprises transmitting turn by turn instructions for the points of interest to the user device.

In another embodiment, the most likely route and the expected destination are determined when a number of users that traveled through the current device location and utilized the most likely route and the expected destination exceeds a predetermined threshold. The predetermined threshold may depend on the current device location. In some instances, the most likely route may be a given route having the largest number of points of interest therealong, when a plurality of routes and destinations are equally likely. Alternatively, the most likely route may be a given route having the most popular point of interest therealong, when a plurality of routes and destinations are equally likely. Additional sampling may be retrieved when the current device location is a secluded location.

In another aspect of the present invention, a processing system for displaying points of interest along a route and destination of a user device is provided. The processing system comprising at least one processor and a predictor module associated with the at least one processor. The predictor module being configured to receive a current device location of the user device; to retrieve historical route and destination data of users that traveled through the current device location; to determine a most likely route and an expected destination of the user device; to retrieve points of interest data for one or more points of interest, the points of interest being located along the most likely route to the expected destination; and to transmit the points of interest data, the most likely route and the expected destination to the user device.

In another aspect of the invention, a processing system comprises a computer readable user location database containing the historical route and destination data and a computer readable point of interest database containing the points of interest data. The predictor module may retrieve additional sampling when the current device location is a secluded location. The processing system may determine that the most likely route and expected destination may be determined when a number of users that traveled through the current device location and utilized the most likely route and the expected destination exceeds a predetermined threshold. The predetermined threshold may depend on the current device location.

In some instances, the predictor module is configured to transmit the point of interest data to a point of interest indicator module of the user device. The predictor module may also be configured to transmit the most likely route and expected destination to a battery indicator module of the user device. Furthermore, the predictor module may be configured to transmit the most likely route and the expected destination to a point of interest indicator module of the user device.

An even further aspect of the invention provides a method for indicating whether a battery of a user device can support use along an inferred route, the method comprising receiving an inferred route and an inferred destination at a processing device; the processing device calculating a travel time to the inferred destination via the inferred route; the processing device calculating a battery discharge time of the battery; and indicating that the battery will not sustain the inferred route and the inferred destination if the battery discharge time is less than the travel time. The inferred route and the inferred destination may be received from a predictor module of a remote server. The travel time may be calculated by dividing a distance to the inferred destination via the inferred route by the current velocity of the device. The current velocity may be calculated by tracking the user device's position. The battery's discharge time may be calculated by dividing the battery's capacity by the battery's discharge rate.

Yet another aspect of the invention provides a processing system for indicating whether a battery of a user device can support use along an inferred route, the system comprising a display unit; a battery monitoring circuit; at least one processor for managing the display unit and the battery monitoring circuit; and a battery life indicator module associated with the at least one processor. The battery life indicator module being configured to receive an inferred route and an inferred destination calculate a travel time to the inferred destination via the inferred route calculate a battery charge time of the battery; and indicate, on the display unit, that the battery will not support use along the inferred route if the battery discharge time is less than the travel time. According to this aspect, the processing may further comprise a GPS receiver coupled to the at least one processor and being configured to provide the device's velocity to the battery life indicator module. A dead reckoning unit coupled may be provided to the at least one processor configured to provide the device's velocity to the battery life indicator module. The inferred route and inferred destination are received from a predictor module of a remote server.

BRIEF DESCRIPTION OF THE DRAWINGS

FIGS. 1A-B illustrate a computer network architecture in accordance with aspects of the invention.

FIG. 3A is a pictorial diagram in accordance with an aspect of the invention.

FIG. 3B is a pictorial diagram in accordance with an aspect of the invention.

FIG. 4 is a flow diagram of a method for providing points of interest information along an inferred route to an inferred destination.

DETAILED DESCRIPTION

Aspects, features and advantages of the invention will be appreciated when considered with reference to the following description of exemplary embodiments and accompanying figures. The same reference numbers in different drawings may identify the same or similar elements. Furthermore, the following description is not limiting; the scope of the invention is defined by the appended claims and equivalents.

Figure 1B:
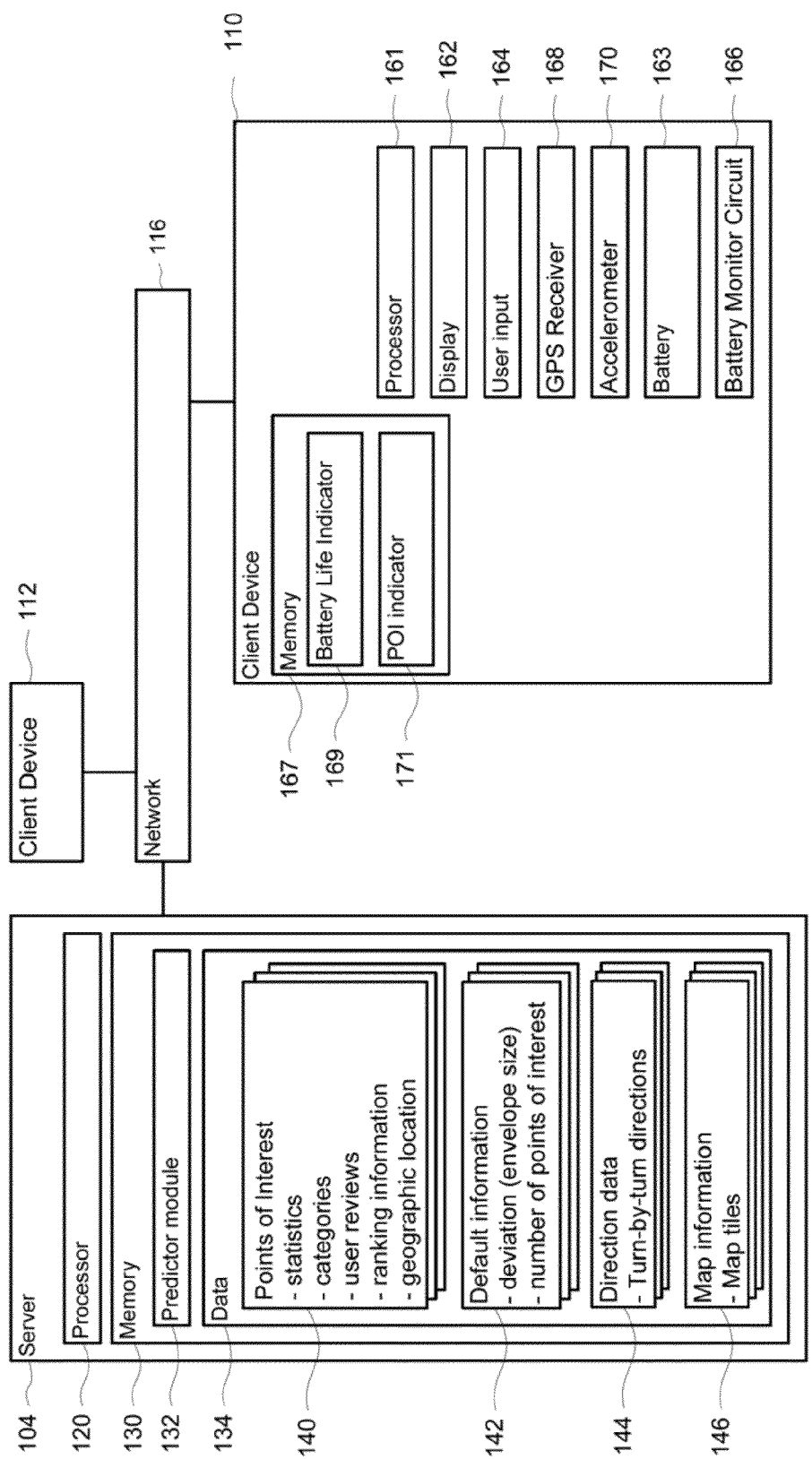

Turning to FIGS. 1A-1B, these illustrations present schematic diagrams of a computer system depicting various computing devices that can be used alone or in a networked configuration in accordance with aspects of the present invention. For example, FIG. 1A illustrates a computer network 100 having a server 104 as well as other types of portable electronic devices such as mobile phone 110, PDA 112, and a laptop 108. Various elements in the computer network 100 may be interconnected via a communications network 116 such as a local area network ("LAN"), a WiFi network, a wide area network ("WAN"), the Internet, etc. and which may be wired or wireless.

Server 104 may be a plurality of interconnected servers working in tandem. Server 104 may also have user inputs such as a keyboard 118 and mouse 120 and/or various other types of input devices such as pen-inputs, joysticks, buttons, touch screens, etc., as well as a display 122, which could include, for instance, a CRT, LCD, plasma screen monitor, TV, projector, etc. By way of example only, server 104 may be a personal computer. As shown in FIG. 1B, server 104 contains a processor 120, memory 130, and other components typically present in a computer.

The memory 130 stores information accessible by processor 120, including predictor module 132 and data 134 that may be executed or otherwise used by the processor 120. The memory 130 may be of any type capable of storing information accessible by the processor, including a computer-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The predictor module 132 may be any set of instructions to be executed directly (such as machine code) or indirectly (such as scripts) by the processor. For example, the instructions may be stored as computer code on the computer-readable medium. In that regard, the terms "instructions" and "programs" may be used interchangeably herein. The instructions may be stored in object code format for direct processing by the processor, or in any other computer language including scripts or collections of independent source code modules that are interpreted on demand or compiled in advance. Functions, methods and routines of the instructions are explained in more detail below.

In one aspect, server 104 communicates with one or more devices such as mobile phone 110, PDA 112, and laptop 108 of FIG. 1A. Each client device may be configured similarly to the server 104, with a processor 161, memory 167, and instructions, such as battery life indicator module 169 and points of interest ("POI") indicator module 171. Like predictor module 132, battery life indicator module 169 and POI indicator module 171 may also employ any set of instructions to be executed directly or indirectly by the processor.

The server 104 and other devices are capable of direct and indirect communication with other computers, such as over network 116. Although only a few computing devices are depicted, it should be appreciated that a typical system can include a large number of connected servers and clients, with each different computer being at a different node of the network.

The network 116, and intervening nodes, may comprise various configurations and protocols including the Internet, intranets, virtual private networks, wide area networks, local networks, private networks using communication protocols proprietary to one or more companies, Ethernet, WiFi, Bluetooth and HTTP. The server 104 may be at one node of a network 116 and capable of directly and indirectly communicating with other nodes of the network. For example, the server 104 may be capable of communicating with client devices via network 116 such that server 104 uses network 116 to transmit and display information to a user, such as user 192 of FIG. 2, using a client device 110. As stated earlier, server 104 may also comprise a plurality of computers that exchange information with different nodes of a network for the purpose of receiving, processing and transmitting data to the client devices. In this instance, the client devices will typically still be at different nodes of the network than any of the computers comprising server 104.

Communication across the network, including any intervening nodes, may be facilitated by any device capable of transmitting data to and from other computers, such as modems (e.g., dial-up or cable), network interfaces and wireless interfaces. Although certain advantages are obtained when information is transmitted or received as noted above, other aspects of the invention are not limited to any particular manner of transmission of information. For example, in some aspects, the information may be sent via a medium such as a disk, tape, CD-ROM, DVD, or directly between two computer systems via a dial-up modem. In other aspects, the information may be transmitted in a non-electronic format and manually entered into the system.

Moreover, computers and client devices in accordance with the systems and methods described herein may comprise any device capable of processing instructions and transmitting data to and from humans and other computers, including network computers lacking local storage capability, PDA's with modems such as PDA 112 and Internet-capable wireless phones such as mobile phone 110.

As shown in FIG. 1A, the network 100 may also include a user location database 133. User location database 133 may contain current and historical positions of all portable device users linked with server 104. The historical records of the portable device users may be archived from a predetermined period. As will be explained further below, the historical position records of user location database 133 may be used to predict a user's route and destination. Network 116 may also include a POI database 136 that may include various locations that may interest visitors along an inferred route and destination. The user location database 133 and POI database 136 may be directly or indirectly coupled to server 104. In an alternative, the user location database 133 and POI database 136 may be part of or otherwise logically associated with the server 104. They may include different sets or types of data. By way of example only, they may maintain location and/or map-related data, which may be stored in one or more KFFs. They may also store data in one or more KFFs. Assets and other information, including satellite data, aerial photographs, digital maps, elevation data, GPS coordinates, etc. may be obtained from one or more sources (not shown).

The POI database 136 may include, but are not limited to, museums, libraries, sculptures, parks, restaurants, hotels, amusement or water parks, bodies of water, or other landmarks. POI database 136 may be populated from any source including, for example, state or private tourism guides, online forums, or other sources. Each POI may be associated with various types of information, including the geographic location, statistics related to the POI such as the average number of visitors per year, user reviews, categories, and ranking information.

The data 134 of FIG. 1B may be retrieved, stored or modified by processor 120 in accordance with the predictor module 132. For instance, although the system and method is not limited by any particular data structure, the data may be stored in computer registers, in a relational database as a table having a plurality of different fields and records, XML documents, etc.

The processor 120 of server 104 and processor 161 of a client device, such as client device 110 of FIG. 1B, may be any conventional processor, such as processors from Intel Corporation or Advanced Micro Devices. Alternatively, the processor may be a dedicated controller such as an ASIC. Although FIG. 1A functionally illustrates the processor and memory as being within the same block, it will be understood by those of ordinary skill in the art that the processor and memory may actually comprise multiple processors and memories that may or may not be stored within the same physical housing. For example, memory may be a hard drive or other storage media located in a server farm of a data center. Accordingly, references to a processor or computer will be understood to include references to a collection of processors or computers or memories that may or may not operate in parallel.

Each client device, such as client devices 108, 110, and 112 may be intended for use by a person 192 and have all of the components normally used in connection with a computer such as the aforementioned processor 161 and memory 167 (e.g., RAM and internal hard drives) storing data and instructions, an electronic display 162 (e.g., a monitor having a screen, a small LCD touch-screen, a projector, a television, a computer printer or any other electrical device that is operable to display information), user input 164 (e.g., a mouse, keyboard, touch-screen or microphone), camera, speakers, a network interface device, and all of the components used for connecting these elements to one another.

The client devices may also include a geographic position component 168, such as a GPS receiver, to determine the geographic location and orientation of the device. For example, client device 110 may use GPS receiver 168 to determine the device's latitude, longitude and altitude position. In another example, the geographic position component may also comprise software for determining the position of the device based on other signals received at the client device 110, such as signals received at a cell phone's antenna from one or more cell phone towers if the client device is a cell phone. In still another example, geographic position component may detect all WiFi networks in the vicinity, measure the strength of the signals from those networks, and use a table of WiFi access point locations to triangulate the geographic position of the client device. It will be understood that any number of geographic positioning systems, alone or in combination, may be used.

As stated earlier, the client devices may include a battery life indicator module 169 that may be a series of computer readable instructions for monitoring the remaining charge available in battery 163. Battery life indicator module 169 may provide an indication to a user, via display 162, of the extant capacity of battery 163 and whether the capacity can sustain an inferred route. This may be done by comparing the time remaining for battery depletion to the time remaining for arrival to an inferred destination. Battery life indicator module 169 may be configured to receive constant updates on the device's current location from GPS receiver 168 and to track the device's position rate of change or velocity. It is understood that battery life indicator module 169 may interface with other types of technology to calculate the device's velocity, such as radio beacons, optical recognition, and dead reckoning systems.

Battery life indicator module 169 may utilize various interface functions to obtain battery related information from conventional circuitry, such as battery monitor circuit 166 of FIG. 1B, adapted to monitor the battery's total capacity and the battery's discharge rate. Battery life indicator module 169 may also receive repeated updates of the batteries discharge rate through these interface functions. Battery capacity is typically measured as milliampere hours ("mAH"), which is determined by multiplying the battery's discharge rate in milliamperes ("mA") by the amount of time the battery is capable of providing that current. The current capacity of a battery mAh divided by the discharge rate mA results in the amount of hours a battery may sustain. Many factors may also be used to determine an accurate discharge rate, such as battery temperature, a battery's age, internal battery resistance, or the batteries chemical structure (e.g., alkaline, lithium, zinc carbon etc.).

Client devices may also include an accelerometer 170 or gyroscope to determine the direction in which the device is oriented. By way of example only, the device may determine its pitch, yaw or roll (or changes thereto) relative to the direction of gravity or a plane perpendicular thereto. In that regard, it will be understood that a client device's provision of location and orientation data as set forth herein may be provided automatically to the user, to the server, or both.

GPS receiver 168 may be capable of transmitting client device location data to server 104 over a network 116, such as the Internet. Processor 120 of server 104 may in turn process the data as required by the predictor module 132 and store the location data in user location database 133.

Server 104 may also store map-related information 146, at least a portion of which may be transmitted to a client device to provide a user with turn-by-turn directions toward a POI. For example and as shown in FIG. 1B, the server may store map information 146, including map tiles, where each tile comprises a map image of a particular geographic area. A single tile may cover an entire region such as a state in relatively little detail and another tile may cover just a few streets in high detail. In that regard, a single geographic point may be associated with multiple tiles, and a tile may be selected for transmission based on the desired level of zoom. The map information is not limited to any particular format. For example, the images may comprise street maps, satellite images, or a combination of these, and may be stored as vectors (particularly with respect to street maps) or bitmaps (particularly with respect to satellite images).

The various map tiles may each be associated with geographical locations, such that the server 104 and/or client device are capable of selecting, retrieving, transmitting, or displaying one or more tiles in response to receiving one or more POI locations. In addition, server 104 may also contain direction data 144 that may be transmitted to POI indicator module 171 in order to provide turn-by-turn directions towards a POI.

It is understood that the sample values, types and configurations of data described and shown in the figures are for illustration purposes only. In that regard, systems and methods in accordance with aspects of the invention may include different web sites, data values, data types and configurations, and may be provided and received at different times (e.g., via different web pages) and by different entities (e.g., some values may be pre-suggested or provided from different sources).

In addition to the operations described below and illustrated in the figures, various operations in accordance with a variety of aspects of the invention will now be described. It should be understood that the following operations do not have to be performed in the precise order described below. Rather, various steps can be handled in reverse order or simultaneously.

Figure 2:
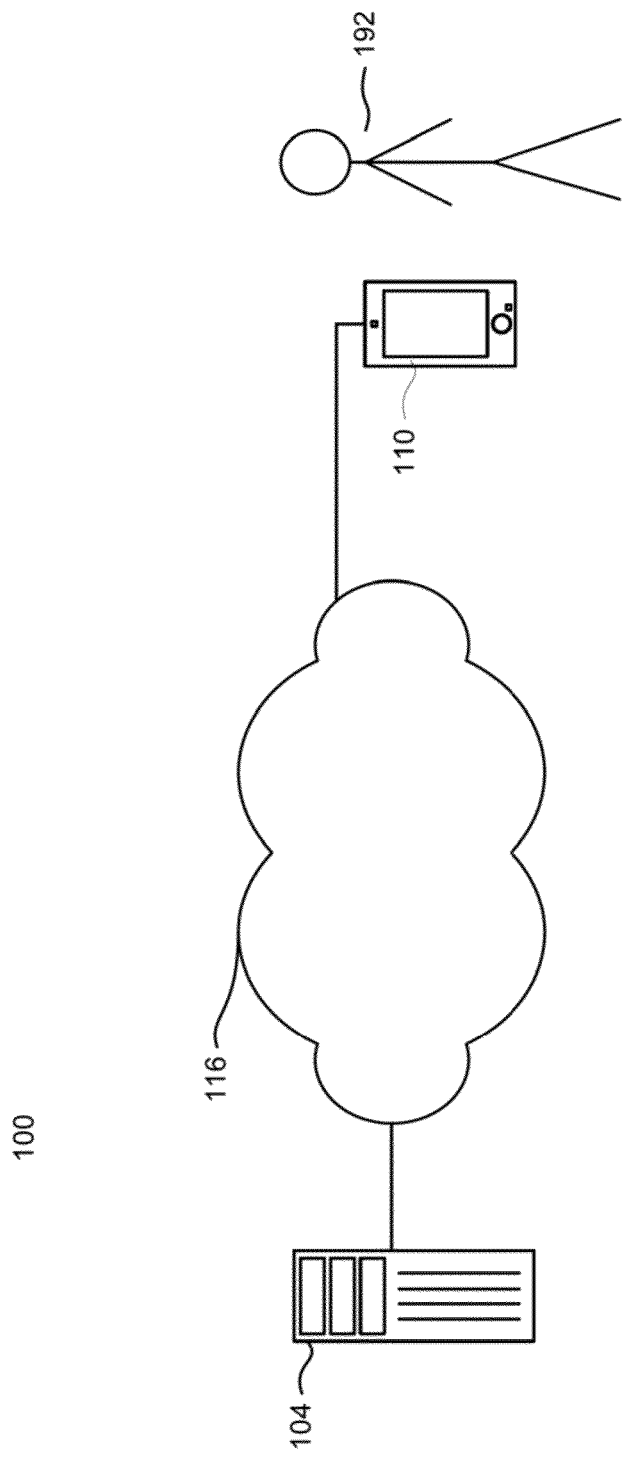
FIG. 2 is a diagram in accordance with an aspect of the invention.

In the example of FIG. 2, a client device, such as client device 110 being used by user 192, may transmit its current location over a network 116, via GPS receiver 168, to server 104. For example, map 300 of FIG. 3A illustrates a location A, which corresponds to current location 210 that may be located along highway 330. After receiving the current location, predictor module 132 may determine the most likely route and destination of a user based on historical data in user location database 133 of all users that traveled highway 330 through current location 210. By way of example, after analyzing all users that have formerly traveled along highway 330 through current location 210, the predictor module 132 may find that eighty percent of users took Exit 11 and were destined for location B, which corresponds to destination 220. The predictor module 132 may be configured to infer a particular route and destination when the number of users that used a particular route to arrive at a destination exceeds an eighty percent threshold. Thus, predictor module 132 may infer that user 192 will take exit 11 and that the destination is destination 220. The threshold for inferring the route and destination may depend on location. For example, if the route travels through a secluded location, the threshold may be lower for routes leading to more populated areas. However, if the entire route is highly populated, the threshold may be set higher. The threshold may also be adjusted according to date and time. For example, traveling patterns on a Monday morning may lead to thresholds that are different than those of Saturday evening.

If an entire route is secluded, server 104 may retrieve additional sampling data to predict a route and destination. The POI database 136 may include events (e.g., concerts, food & wine festivals, etc.) that may be of interest along a route. The inferred route and destination may be based on event data, if the historical data for the current location in user location database 133 is not adequate for determining a route.

Using the inferred route and destination, the predictor module 132 may identify POIs. FIG. 3B depicts an illustrative screen shot of POIs 550-552 to display on a client device as may be determined by predictor module 132. In one embodiment, if a plurality of routes and destinations are equally likely, predictor module 132 may query POI database 134 to help distinguish between the routes and destinations. For example, one of the routes or destinations may have more POIs and therefore more likely than the others. Alternatively, the popularity of a POI may be used as a distinguishing factor. The predictor module 132 may transmit the POIs to POI indicator module 171 of device 110. POI indicator module 171 may be adapted to display the POIs to a user 192 via display 162.

These POIs may be filtered by various methods, including categories. Categories may be preselected by the server or identified by a user and transmitted by a client device. For example, a user may select or request POIs related to museums, such that the selected POIs will correspond to locations such as parks, museums, or hotels. In another example, a user may provide additional information specific to the POI in which the user is interested. For example, a user may provide a request such as "'Boston' to 'Florida,' stopping at a 'cheap motel.'"

In another example, a user may select a time frame or a specific date and time. Thus, the server may filter out locations which have operating hours which do not fit into the specified date and time data. If, for example, a POI such as a garden is open only during April through November from 9:00 am to 1:00 pm, and the user identifies a category corresponding to December at 12:00 pm, this POI may be filtered by removing the garden POI from the determined POIs, or simply not consider the garden POI at all. Any number of categories may be selected, identified, and used. In addition, rather than using categories to merely filter the POIs, categories may be considered when ranking the POIs.

In addition to providing the POI locations above, the predictor module 132 may also transmit the inferred route and destination to battery life indicator module 169. As stated earlier, battery life indicator module 169 may prompt a user if the extant battery charge is less than necessary to sustain the trip. By way of example, predictor module 132 may infer a route and destination that is sixty miles away, and battery life indicator module 169 may measure the device's velocity to be thirty miles an hour. Under these circumstances, the trip will take approximately two hours at the current velocity. If an end device battery, such as battery 163 of FIG. 1B, is five volts with a capacity of 1500 mAH and the battery is discharging at 800 mA the battery would discharge in about 1.875 hours, which is less than the two hours it will take to arrive at the inferred destination. In this case, battery life indicator module 169 may provide an alert, via display 162, to a user indicating that the extant battery charge may not sustain the entire trip, based on the current velocity and battery discharge rate. This will prompt the user to conserve an end device's battery resources during a trip by using it less frequently, closing large applications, etc.

Figure 5:
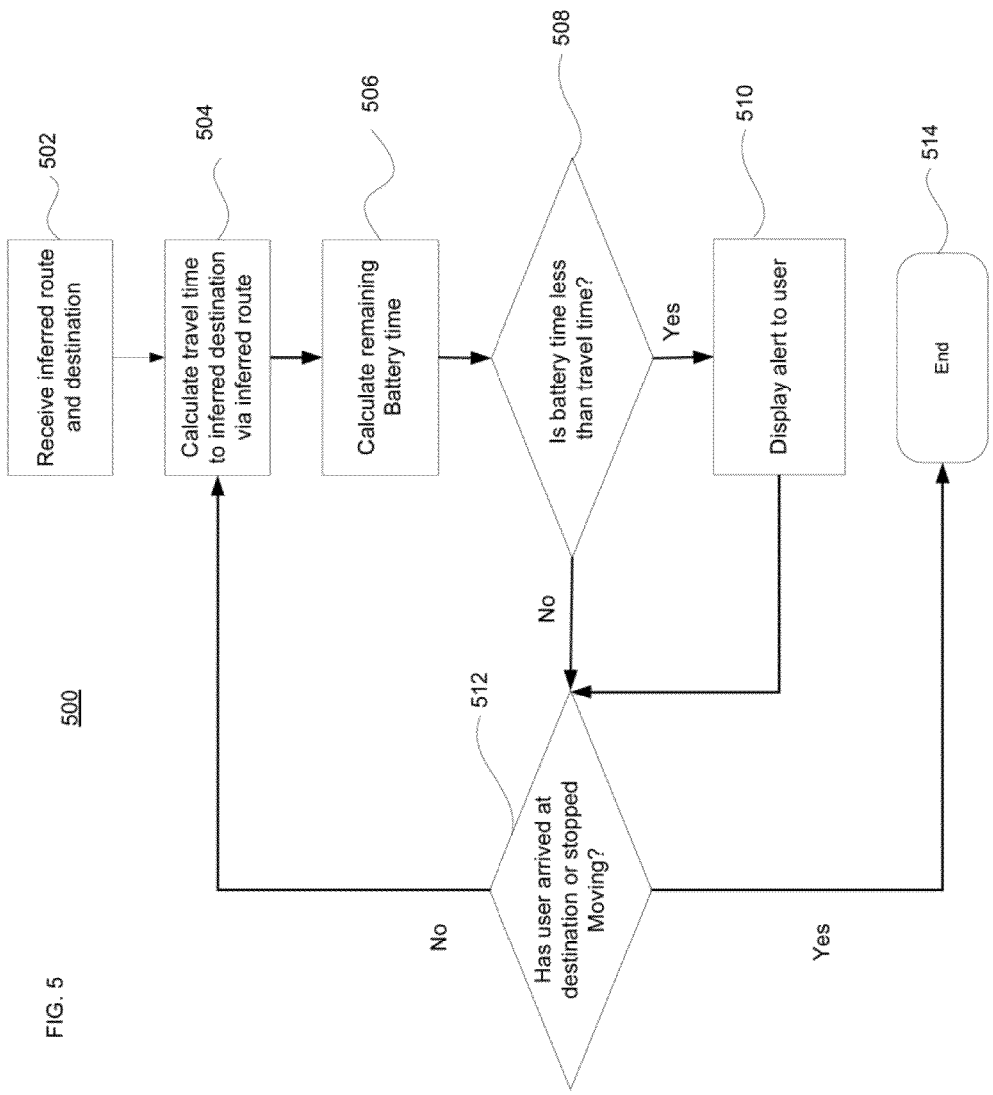
FIG. 5 is a flow diagram of a method for alerting a user when the extant capacity of a battery will not sustain an inferred route to an inferred destination.

FIGS. 4-5 depict an illustrative summary of the processes described above. FIG. 4 provides an illustrative embodiment of a method 400 implemented by predictor module 132. In block 402, predictor module 132 may receive a current device location from a client device. Next, predictor module 132 may retrieve historical route and destination data of users that traveled through the current device location, in block 404. Then, in block 406, predictor module 132 may infer a most likely route and destination of the user. As stated earlier, a predetermined popularity threshold may be used to infer the most likely route and destination. Next, in block 408, predictor module 132 determines if more than one route and destination are equally likely. If predictor module 132 determines that only one route and destination is likely, predictor module 132 may advance to block 416 and retrieve POIs for the route and destination. If predictor module 132 determines that multiple routes and destinations are equally likely, predictor module 132 may advance to block 410 and retrieve POIs for the plurality of routes and destinations. Then, in block 412, predictor module 132 may infer that the route and destination with the most POIs is the most likely route and destination. Alternatively, predictor module 132 may infer that the route and destination with the most popular POIs is the most likely route and destination. In block 414, predictor module 132 may transmit the points of interest, the inferred route, and the inferred destination to POI indicator module 171. Also in block 414 predictor module 132 may transmit the inferred route and destination to battery life indicator module 168. In addition, predictor module 132 may transmit turn by turn directions to POI indicator module 171. In block 418, the process ends.

FIG. 5 provides an illustrative embodiment of a method 500 implemented by battery life indicator module 169 of an end device. In block 502, battery life indicator module 169 may receive an inferred route and destination. Next, battery life indicator module 169 calculates a travel time to the inferred destination via the inferred route in block 504. As stated earlier, this may be done by calculating the number of miles to the inferred destination, calculating the velocity of the device, and dividing the number of miles by the velocity. In block 506, battery life indicator module 169 may calculate the device's battery charge time. This may be done by dividing the battery's extant capacity by the battery's current discharge rate. Battery life indicator module 169 may retrieve the necessary battery information by interfacing with suitable battery monitoring circuitry 166. Next, in block 508, battery life indicator module 169 determines whether the device's battery discharge time is less than the inferred destination travel time. If the device's battery charge time is less than the travel time to the destination, battery life indicator module 169 may advance to block 510 and display a user alert indicating that the battery will not sustain the entire trip at the device's current velocity and battery discharge rate. If the device's battery charge time is greater than or equal to the time to the inferred destination, battery life indicator module 169 may advance to block 512 and determine whether the device has arrived at the inferred destination or has stopped. If the device has not arrived at the inferred destination or has not stopped, battery life indicator module 169 may loop back to block 504 to calculate the device's current velocity. This loop may continue throughout the entire trip. Otherwise, battery life indicator module 169 may advance to block 514 and end.

As these and other variations and combinations of the features discussed above can be utilized without departing from the invention as defined by the claims, the foregoing description of exemplary embodiments should be taken by way of illustration rather than by way of limitation of the invention as defined by the claims. It will also be understood that the provision of examples of the invention (as well as clauses phrased as "such as," "e.g.", "including" and the like) should not be interpreted as limiting the invention to the specific examples; rather, the examples are intended to illustrate only some of many possible aspects.

Although the invention herein has been described with reference to particular embodiments, it is to be understood that these embodiments are merely illustrative of the principles and applications of the invention. It is therefore to be understood that numerous modifications may be made to the illustrative embodiments and that other arrangements may be devised without departing from the spirit and scope of the invention as defined by the appended claims. Furthermore, while particular processes are shown in a specific order in the appended drawings, such processes are not limited to any particular order unless such order is expressly set forth herein.

The invention claimed is:

1. A method for indicating whether a battery of a user device can support use along an inferred route, the method comprising:
   determining a current location of a processing device;
   transmitting the current location to a remote server;
   automatically receiving, from the remote server, an inferred route and an inferred destination at the processing device, wherein the inferred route and the inferred destination are determined by the remote server based on the current location and a plurality of stored historical routes that travelled through the current location;
   the processing device calculating a travel time that indicates an amount of time needed to travel from the current location to the inferred destination via the inferred route;
   the processing device calculating a battery discharge time of the battery, wherein the battery discharge time indicates an amount of time that the battery is predicted to be able to sustain the processing device; and
   indicating that the battery will not sustain the inferred route and the inferred destination if the battery discharge time is less than the travel time.

2. The method of claim 1, wherein the travel time is calculated by dividing a distance to the inferred destination via the inferred route by a current velocity of the device.

3. The method of claim 2, wherein the current velocity is calculated by tracking the user device's position.

4. The method of claim 1, wherein the battery discharge time is calculated by dividing a capacity for the battery by a discharge rate for the battery.

5. A processing system for indicating whether a battery of a user device can support use along an inferred route, the system comprising:
   a display unit;
   a battery monitoring circuit;
   at least one processor for managing the display unit and the battery monitoring circuit; and
   a battery life indicator module associated with the at least one processor, the battery life indicator module being configured to:
      receiving a current location of the processing system from a GPS receiver;
      transmit the current location to a remote server;
      automatically receive, from the remote server, an inferred route and an inferred destination, wherein the inferred route and the inferred destination are determined by the remote server based on the current location and a plurality of stored historical routes that travelled through the current location;
      calculate a travel time that indicates an amount of time needed to travel from the current location to the inferred destination via the inferred route;
      calculate a battery discharge time of the battery, wherein the battery discharge time indicates an amount of time that the battery is predicted to be able to sustain the processing device; and
      indicate, on the display unit, that the battery will not support use along the inferred route if the battery discharge time is less than the travel time.

6. The processing system of claim 5, further comprising the GPS receiver coupled to the at least one processor and being configured to provide the device's velocity to the battery life indicator module.

7. The processing system of claim 5, further comprising a dead reckoning unit coupled to the at least one processor configured to provide the device's velocity to the battery life indicator module.

8. The processing system of claim 5, wherein the travel time is calculated by dividing a distance to the inferred destination via the inferred route by the user device's velocity.

9. The processing system of claim 5, wherein the battery discharge time is calculated by dividing a capacity for the battery by a discharge rate for the battery.

10. The processing system of claim 9, wherein the battery life indicator module receives the capacity for the battery and the discharge rate for the battery from the battery monitoring circuit.

* * * * *